United States Patent
Hoyl et al.

(10) Patent No.: US 6,655,643 B1
(45) Date of Patent: Dec. 2, 2003

(54) FLEX CIRCUIT CABLING WALLET

(75) Inventors: Bradley S. Hoyl, Frisco, TX (US);
Michael N. Gish, Allen, TX (US);
Maurice Robertson, Rowlett, TX (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/822,888

(22) Filed: Mar. 30, 2001

(51) Int. Cl.[7] .................................................. F16L 3/22
(52) U.S. Cl. ..................... 248/68.1; 248/909; 248/53; 248/74.3; 312/223.6; 312/108
(58) Field of Search ............................ 248/909, 548, 248/53, 74.3, 69, 205.2; 24/306, 16 PB, 129 B, 30.5 P, 30.5 R; 312/223.6, 108, 50.02

(56) References Cited

U.S. PATENT DOCUMENTS

| | | | | |
|---|---|---|---|---|
| 3,889,684 A | * | 6/1975 | Lebold ...................... 128/402 |
| 4,988,338 A | * | 1/1991 | Taylor et al. ............... 604/180 |
| 5,235,136 A | * | 8/1993 | Santucci et al. ............ 174/68.3 |
| 5,242,063 A | * | 9/1993 | Ericksen et al. ............. 211/87 |
| 5,535,787 A | * | 7/1996 | Howell ....................... 138/167 |
| 5,604,961 A | * | 2/1997 | Cole ........................... 24/306 |
| 5,624,403 A | * | 4/1997 | Jaquith ....................... 604/179 |
| 5,691,021 A | | 11/1997 | Kobe ......................... 428/40.1 |
| 6,044,525 A | | 4/2000 | Sastre et al. ................. 24/20 R |
| 6,349,904 B1 | * | 2/2002 | Polad ......................... 248/74.3 |

OTHER PUBLICATIONS

Bradley S. Hoyl, Carl G. Harrison, Maurice Robertson; "Fiber Optic Cabling Management Using Hook And Loop Fabric"; 16 pages of Specification (including Claims & Abstract); Five (5) Sheets of Drawings; Filed Mar. 19, 2001. (Copy Enclosed).

* cited by examiner

*Primary Examiner*—Kimberly Wood
(74) *Attorney, Agent, or Firm*—Campbell Stephenson Ascolese LLP (57) ABSTRACT

An apparatus and method for supporting and protecting flex circuits are provided. A flex circuit cabling wallet has a first cover, a second cover, and a fold line that is coupled to the first and second covers. The first cover includes a latching mechanism. The second cover includes at least one latch tab. The latch tab is configured to create a releasable bond with the latching mechanism. When the releasable bond is engaged, the first cover, fold line area, second cover, and latch tab enclose the base of a flex circuit. In at least one embodiment, a cable fastener is also provided. The cable fastener attaches to the first cover of the flex circuit cabling wallet, thereby segregating the flex circuit from cables.

15 Claims, 7 Drawing Sheets

FLEX CIRCUIT CABLING WALLET

BACKGROUND OF THE INVENTION

1. Field of the Invention

This invention relates to telecommunications equipment and, more particularly, to the support and protection of flex circuits within a telecommunications system.

2. Description of the Related Art

In the telecommunications and data transmission industries, optical fibers, rather than metal cables, are used increasingly to transmit signals. The technology uses glass or plastic threads (fibers) to transmit data. A fiber optic cable consists of a bundle of threads, each of which is capable of transmitting messages modulated into light waves. Fiber optic cables are utilized in communication systems for carrying information between communication sources and sinks. An example of a communication system that utilizes fiber optic cable is an optical cross connect for a communications network.

The use of optical fibers to transmit data in the telecommunications industry has grown dramatically in recent years. With the increased use of optical fiber transmission paths, the industry has experienced a dramatic need for new and improved ways to effect fiber optic connections efficiently and with as little overhead costs as possible. This need becomes more critical and difficult to meet in newer systems that require increasingly large numbers of cables to be efficiently housed in a relatively small space. The high density of such systems creates a need for an organizational system that provides convenient access to the cables in order for technicians and test personnel to readily access a particular cable that needs to be removed, replaced, or otherwise accessed. As systems become more dense, it also becomes more difficult to route and manage the large amounts of optical cables within and between optical communications equipment. By density, it is meant the number of locations per unit volume or unit area for providing connections between fiber optic cables on the chassis.

One approach towards managing cable in dense systems is to remove the bulky "jacket" that encloses the fibers in a traditional fiber optic cable. Instead, the fibers are laminated between pieces of thin laminate material. Such laminated fiber optic cables are sometimes referred to as "flex circuits."

SUMMARY OF THE INVENTION

An apparatus is provided wherein the apparatus has a first cover, a second cover, and a fold line that is coupled to the first and second covers. The first cover includes a latching mechanism. The second cover includes at least one latch tab. The latch tab is configured to create a releasable bond with the latching mechanism. When the releasable bond is engaged, the first cover, fold line area, second cover, and latch tab enclose the base of a flex circuit.

A method of managing cable is also provided. The method includes the steps of supporting at least one flex circuit with a flex circuit cabling wallet. The flex circuit cabling wallet includes a first cover, a second cover, a fold line area, a latching mechanism, and at least one latch tab. The step of supporting at least one latch tab with a flex circuit cabling wallet further comprises enclosing the base of a flex circuit with the first cover, second cover, fold line area, and latch tab by creating a releasable bond between the latching mechanism and the at least one latch tab.

An apparatus is also provided wherein the apparatus comprises a means for supporting at least one flex circuit. The flex circuit has a base, and the flex circuit is supported such that the base of the flex circuit is substantially enclosed. By this, it is meant that the fingers of a flex circuit protrude from the supporting structure, but that the base from which the fingers of the flex circuit extend is substantially enclosed by the supporting structure. In at least one embodiment, the supporting structure is a flex circuit cabling wallet or its equivalent. In at least one embodiment, the flex circuit is protected from contact with cables, but may be in contact with one or more other flex circuits.

An apparatus is also provided wherein the apparatus comprises a first cover, a second cover, and a fold line area. The fold line area is coupled to the first cover and the second cover. The apparatus further includes at least one latch tab coupled to the second cover and also includes a cable fastener. The cable fastener includes a hook and loop mechanism. The first cover includes a latching mechanism. The at least one latch tab is configured to create a releasable bond with the latching mechanism. The first side, fold line area, second side, and latch tab are configured to enclose the base of at least one flex circuit when the releasable bond is engaged. The cable fastener is configured to create a releasable engagement bond with the first cover. The second cover is coupled to a housing frame.

BRIEF DESCRIPTION OF THE DRAWINGS

The present invention may be better understood, and its numerous objects, features, and advantages made apparent to those skilled in the art by referencing the accompanying drawings.

FIG. 5, including

FIG. 7, including

DETAILED DESCRIPTION

The following sets forth a detailed description of a mode for carrying out the invention. The description is intended to be illustrative of the invention and should not be taken to be limiting.

Optical flex circuits are designed to reduce the number and bulk of fiber optic cables. A flex circuit improves reliability and assembly by grouping individual optic fibers laminated between a protective covering. The flex circuits hold more fibers than traditional cables, but in less space. The tradeoff, however, is that flex circuits are much more fragile than traditional jacketed fiber optic cables.

Flex circuits and jacketed cables are often routed through the same space within the housing frame of a fiber optic communications system. Traditionally, plastic cable ducts and/or plastic tie wraps have been used to support both traditional jacketed cables as well as flex circuits.

Figure 1:
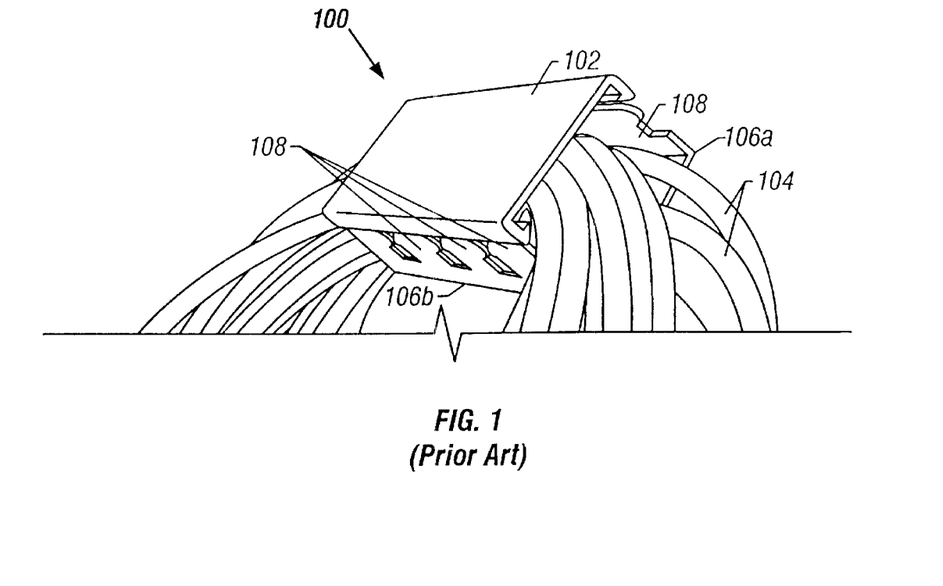
FIG. 1 illustrates a plan view of a prior art cable duct.

FIG. 1 illustrates a prior art cable duct 100. The cable duct 100 is constructed of a rigid material, such as commercial-grade plastic, and has a rectangular cross section with a removable lid 102 to protect the jacketed cables 104. The sidewalls 106 are shaped to form separated fingers 108, or flanges, that allow jacketed cables 104 to pass between them. The fingers 108 and the sidewalls 106 support the cables 104 and provide a surface with which the removable lid 102 may engage.

Figure 2:
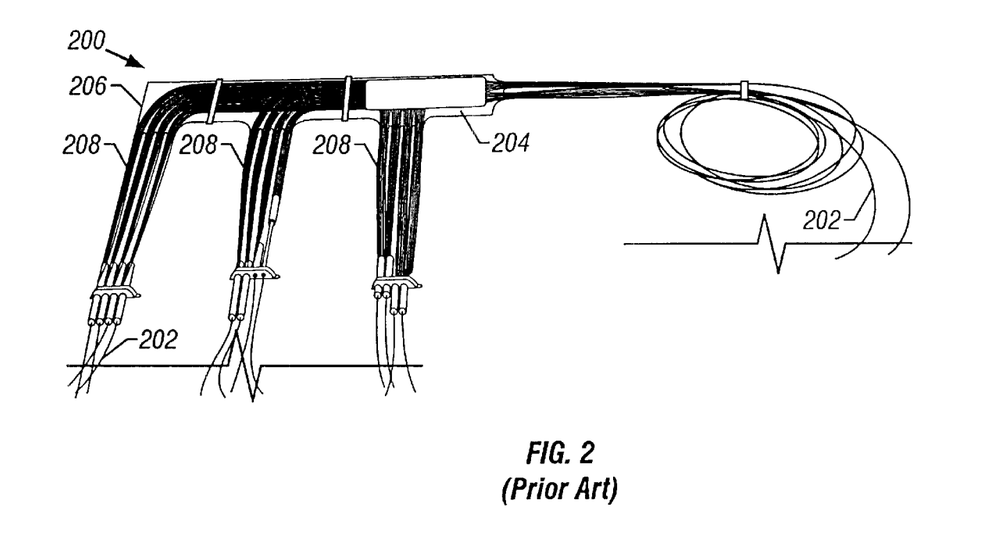
FIG. 2 illustrates a fiber optic flex circuit.

FIG. 2 illustrates a fiber optic flex circuit 200. In at least one embodiment, the flex circuit 200 is composed of strands 202, where each strand 202 is a plurality of raw fiber optic fibers. In at least one embodiment, each strand is composed of eight fibers. The strands are laminated between sheets of laminate material 204. The laminate material 204 is shaped to form a base 206, with the strands 202 being laminated into fingers 208 that extend from the base 206.

Figure 3:
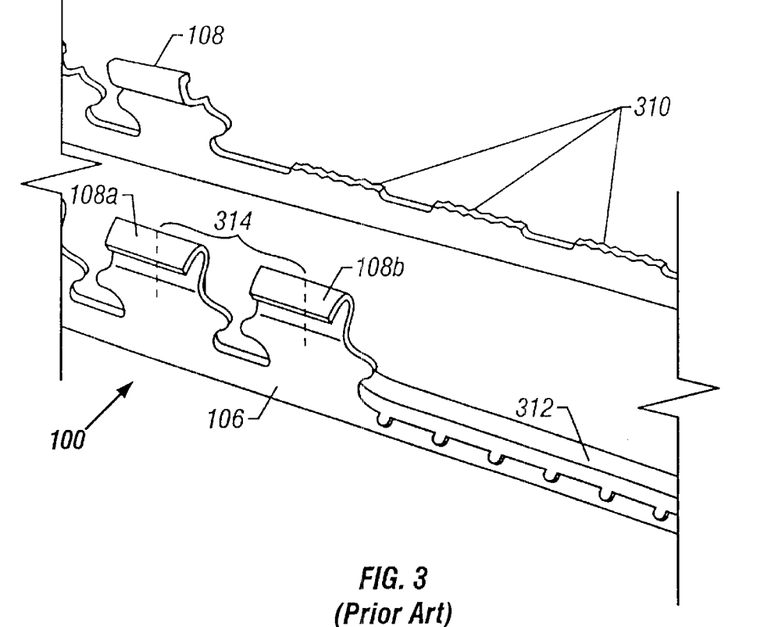
FIG. 3 illustrates a prior art cable duct and grommet.

FIG. 3 illustrates a cable duct 100 that has been modified to accommodate a flex circuit. Unlike jacketed cables, flex circuits vary in size and shape. Therefore, it is often necessary to make extreme modifications to a cable duct 100 in order to allow flex circuits to pass through the sidewall 106 of a cable duct 100. The fingers 108 are designed to be capable of removal by yielding and breaking when appropriately stressed. In order for a flex circuit to be supported within a cable duct, one or more of the fingers 108 must be broken off.

FIG. 3 illustrates a cable duct 100 that has been modified by breaking off several of the fingers 108. The broken edges present a jagged surface 310. If a flex circuit or optical fibers rub against the broken edge 310, the flex circuit is at risk of damage because the glass fibers and laminate material of the flex circuit are relatively delicate. In order to attempt to alleviate this risk, a grommet 312 may be applied to the edge of the cable duct to cover the rough edges produced by the breaking of the fingers 108. The grommet placement is a tedious and time-consuming process because the grommet 312 must be cut to the specific required length and applied in sections.

Figure 4:
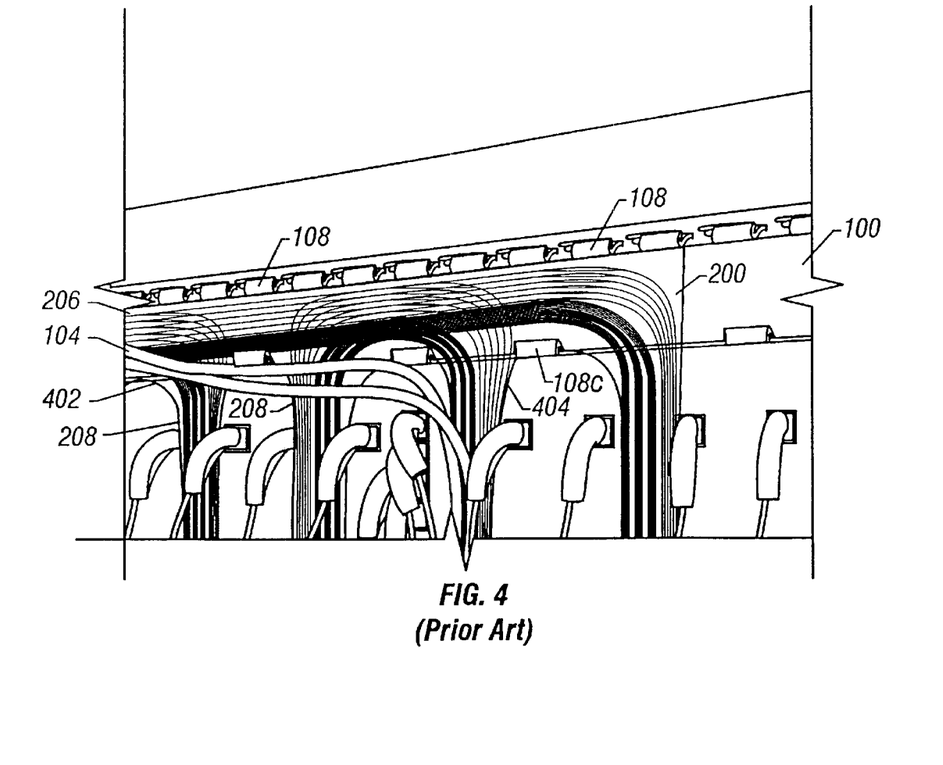
FIG. 4 illustrates a cable system incorporating a prior art cable duct.

FIGS. 3 and 4 illustrate that the extreme modifications to a cable duct 100 illustrated in FIG. 3 often render the cable duct 100 incapable of properly protecting and supporting the flex circuit that passes through the cable duct 100. For instance, a standard off-the-shelf cable duct 100 contains fingers 108 of a certain "pitch." That is, the spacing from the centerline of one finger 108a to the centerline of the next finger 108b is at a predetermined spacing interval 314, with the interval 314 being determined by the manufacturer. Because the flex circuits are very precisely sized, it is sometimes necessary to break off only ½ or ⅓ of a finger 108 in order to accommodate the flex circuit while still maintaining adequate support. This is a difficult and imprecise task, since the fingers 108 are not designed to break off in sections. If, instead, only entire fingers 108 are broken to accommodate flex circuits, then entire sections of the flex circuit 200, such as section 402 illustrated in FIG. 4, go unsupported. On the other hand, if a portion of a finger 108c is not broken off as needed, then damage to a section, such a section 404 illustrated in FIG. 4, may occur due to rubbing or pinch caused by the finger 108c.

Typically, drafting figures and documentation must be generated in order to inform manufacturing personnel which fingers 108, or portions thereof, are to be broken off to accommodate the desired flex circuit 200. Different cable duct manufacturers often utilize different "pitch" values. Therefore, if a switch from one manufacturer's cable duct to another is desired, design and documentation efforts must be repeated.

Figure 5A:
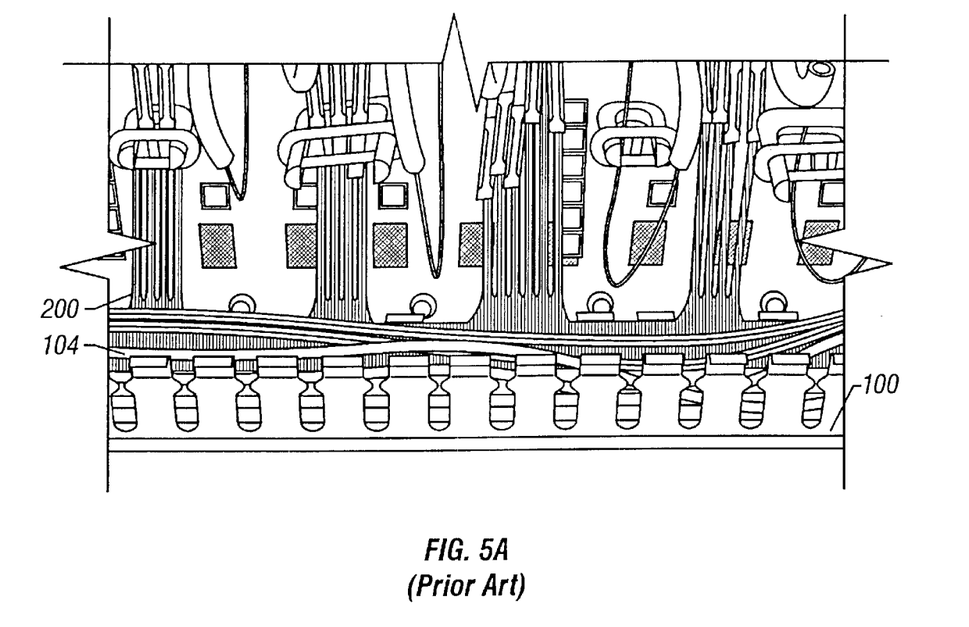
FIG. 5a and FIG. 5b, illustrates a cable system incorporating a prior art cable duct to support both jacketed cables and flex circuits.
Figure 5B:
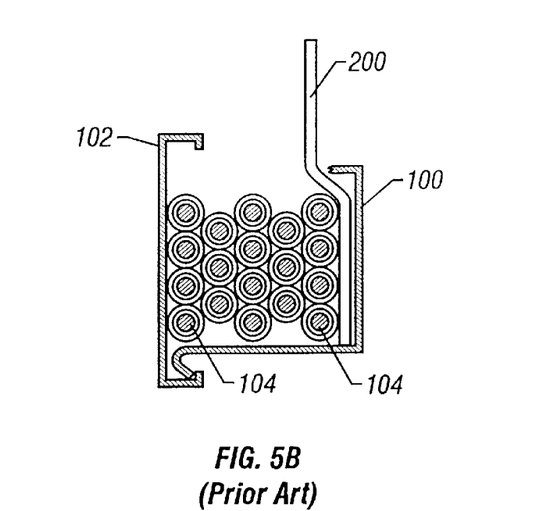

FIGS. 4 and 5, including FIGS. 5a and 5b, illustrate that, when flex circuits 200 and traditional jacketed cables 104 are both housed in a traditional cable duct 100, the lack of physical separation between the two types of cables presents maintenance and integrity challenges. Jacketed cables 104 that lie within cable duct 100 come into direct contact with the flex circuit 200. Since flex circuits 200 are relatively fragile, direct contact between flex circuits 200 and jacketed cables 104 can lead to performance degradation in the flex circuits 200. Such direct contact can also lead to chafing, which can cause surface tears in the flex circuits 200.

FIGS. 2 and 4 illustrate that the unjacketed strands 202 of a flex circuit can "dress down" vertically within a fiber optic communications system. If these unjacketed strands 202 are routed through a vertically-mounted traditional cable duct along with jacketed cables, then harmful chafing of the glass strands 202 by adjacent jacketed cables can occur.

FIG. 5b illustrates that maintenance challenges arise when a flex circuit 200 and jacketed cables 104 are housed within the same cable duct 100. For instance, installation of the cables into the cable duct 100 is typically performed by placing the flex circuit 200 into the duct 100 first, and then adding jacketed cables 104 into the duct 100. Because the jacketed cables 104 obstruct access to the flex circuit 200, all of the cables 104 must be removed from the duct 100 any time the flex circuit 200 is reworked, repaired, or replaced.

Figure 6:
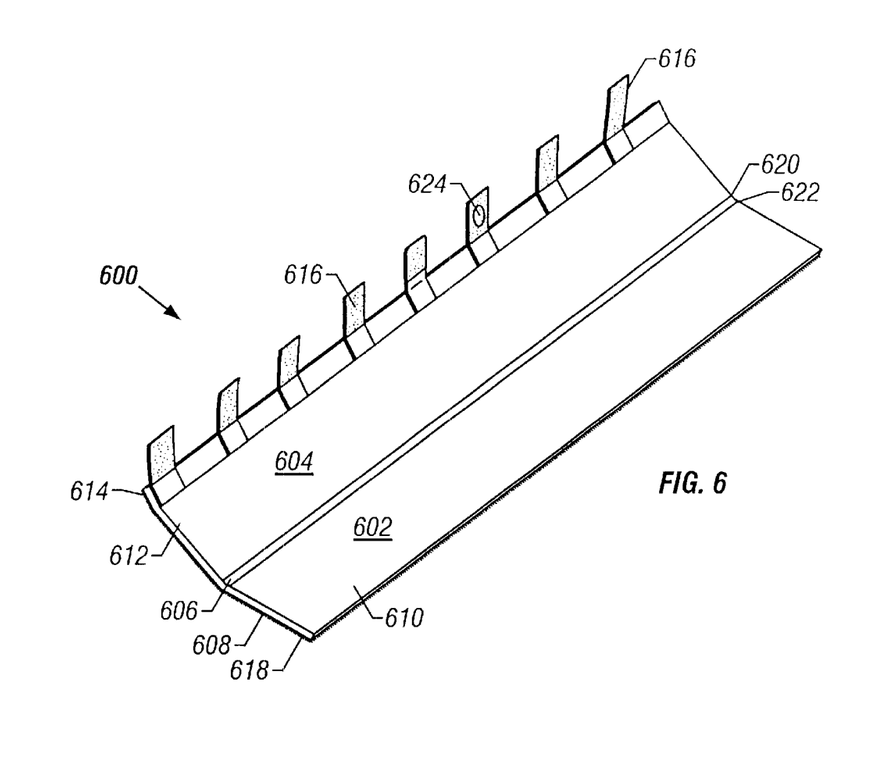
FIG. 6 illustrates a flex circuit cabling wallet according to at least one aspect of the present invention.

FIG. 6 illustrates a flex circuit cabling wallet 600 according to at least one aspect of the present invention. The wallet 600 includes two covers 602 and 604 that are designed to rest in a position substantially parallel with each other when closed toward each other along a fold line area 606. Each of the covers 602, 604 has a first side 610, 612, respectively, and a second side 608, 614, respectively.

One skilled in the art will recognize that the fold line area 606 could be one of several configurations that facilitate folding of the wallet 600 such that the first sides 610, 612, respectively, of the covers 602, 604 come into substantially parallel contact with each other or with something sandwiched between them (such as the base of a flex circuit). The wallet 600 thus provides a means for supporting at least one flex circuit having a base 206 (FIG. 2) such that base 206 is substantially enclosed.

In at least one embodiment, the first cover 602, fold line area 606, and second cover 604 are of unitary construction from a relatively rigid material, such as commercial-grade plastic, paper, or vinyl, with the fold line being a scored area or an area wherein the material is thinner than the material of the covers 602, 604 in order to facilitate folding. In the preferred embodiment, the covers 602, 604 are of a relatively rigid material, while the fold line is made from a more malleable material, such as vinyl. The second sides are attached to the fold line material by means of a hook and loop bond or other mechanism such as rivets, snaps, or adhesive. The material that forms the covers 602, 604 is placed upon the material forming the fold line area 606 such that the covers 602, 604 are not quite touching along their horizontal edges 622, 620, respectively. This configuration allows the malleable fold line area material to bend and permit folding, much like the cover on the spine of a book folds to permit closing of the front and back book covers.

For reasons discussed below, it is advantageous for the second side 608 of at least one of the covers 602 to include a hook and loop latching mechanism 618. The cover 602 that includes a latching mechanism 618 is referred to herein, for the sake of convenience, as the first cover 602. One skilled in the art will recognize that the first cover 602 can be constructed of a material having a latching mechanism on one side, or that the first cover could be constructed of one material and could be coupled to a second material that provides the latching mechanism. In the preferred embodiment, the first cover 602 and the latching mechanism 618 are of a unitary construction, being constructed from a piece of a hook and loop sheet material. As used in this application, "hook and loop" is used in a generalized sense to mean any of several reclosable fastening materials, such as Velcro™. While referred to as "hook" and "loop," the latching mechanism 618 need not necessarily comprise hooks or loops, but rather may contain any of several engagement mechanisms. For instance, in the preferred embodiment, a flame-retardant industrial-grade material produced by 3M™ is used for the first cover 602/latching mechanism 618. The material contains only the equivalent of "hooks," but they are not actually hooks. The material, known as Dual Lock™, is a polypropylene material containing hundreds of mushroom-shaped stems per square inch. When two pieces of Dual Lock™ material are pressed together, the mushroom-shaped stems interlock with each other, creating a separable bond. Alternative versions of Dual Lock™ materials provide pine-tree-shaped stems. A flame retardant Dual Lock™ fastener is further described in U.S. Pat. No. 5,691,021 issued to Kobe. As used herein, the term "hook and loop" is intended to encompass Velcro™, Dual Lock™, and any other similar material that provides a means for creating a releasable engagement bond.

A plurality of latch tabs 616 are provided, the latch tabs 616 being coupled to at least one of the covers 604. For the sake of convenience, the cover 604 coupled to the latch tabs 616 is referred to herein as the second cover 604. The latch tabs 616 are configured to provide a means for creating a releasable engagement bond with the latching mechanism 618. In this manner, the wallet 600 can easily be opened and closed. While they could contain any of the hook and loop type mechanisms described above (loop, hook, mushroom-shaped stem, pine-tree-shaped stem, etc.), the latch tabs 616 of the preferred embodiment are constructed of a material containing loops 624 that create a separable bond when pressed into contact with the mushroom-shaped stems of the latching mechanism 618. In at least one alternative embodiment, the latch tabs 616 are constructed of any durable material, and the material containing loops 624 is coupled to the latch tabs 616 by adhesive or other coupling means.

Figure 11:
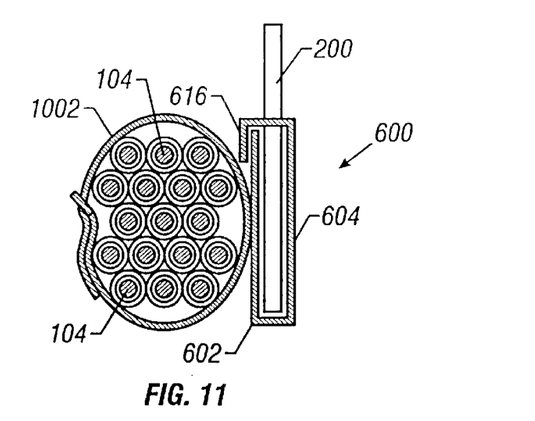
FIG. 11 illustrates a cross-sectional view of at least one embodiment of a fiber optic cabling wallet having additional cables attached via a cable fastener.
Figure 12:
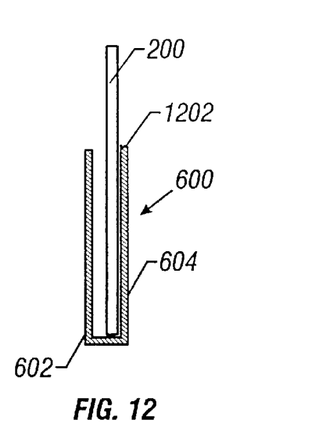
FIG. 12 illustrates a cross-sectional view of at least one embodiment of a fiber optic cabling wallet having at least one latch tab removed.

FIG. 12 illustrates that the latch tabs 616 (FIG. 11) are removable. In at least one embodiment, the latch tabs 616 are configured to be relocatable using hook-and loop bonds, snaps, or other means of separable bond. In such embodiment, the placement of the latch tabs 616 may be easily rearranged to accommodate the flex circuit 200 without creating a jagged edge. In addition, the configuration of the latch tabs may be easily rearranged to accommodate a new or different flex circuit 200. In the preferred embodiment, the latch tabs are removable by a simple severing means such as cutting or breaking. FIG. 12 illustrates that, when the latch tabs 616 are removed, the point of removal 1202 does not pose the threat of damaging a flex circuit that is posed by removal of fingers from traditional cable ducts (see discussion of FIG. 3, above). This is because the point of removal 1202 is on the second cover 604, which is configured to be relatively parallel with the flex circuit 200. Due to this orientation, the flex circuit 200 does not pass over the point of removal 1202.

Figure 7A:
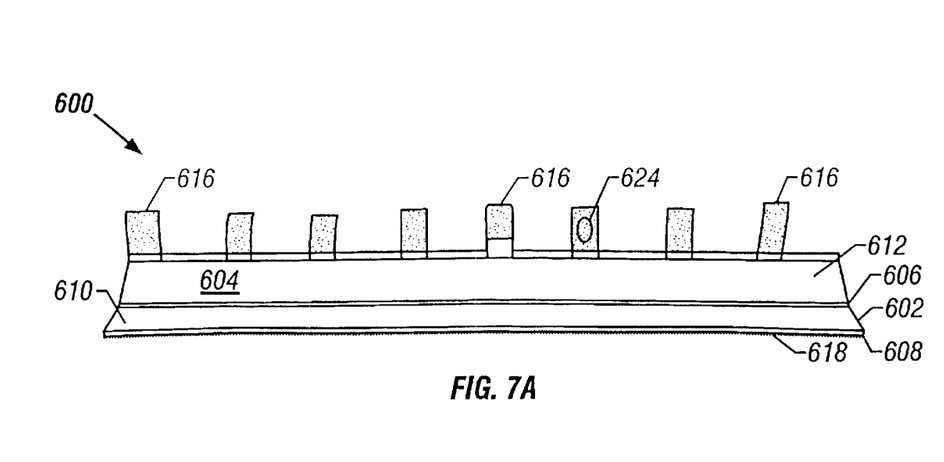
FIG. 7a and FIG. 7b, illustrates a flex circuit cabling wallet according to at least one aspect of the present invention.
Figure 7B:
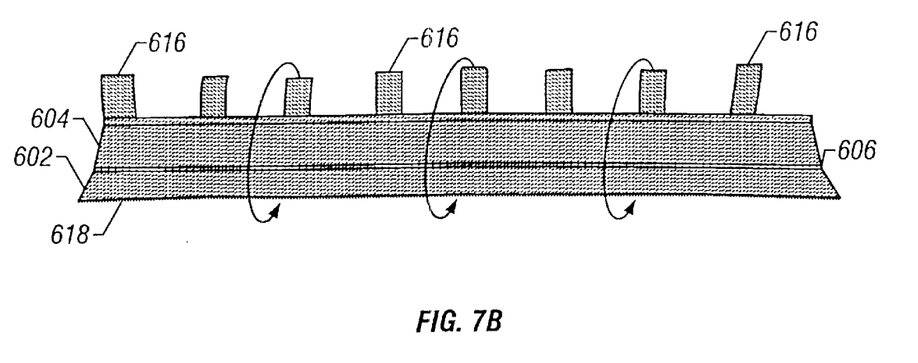
Figure 8:
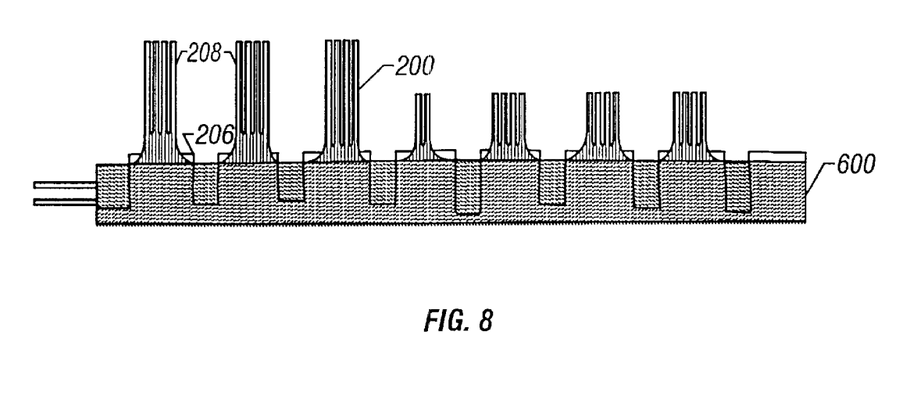
FIG. 8 illustrates a flex circuit supported by a flex circuit cabling wallet according to at least one aspect of the present invention.

FIGS. 7 and 8, including FIGS. 7a and 7b, illustrate that the wallet 600 is configured to wrap around the flex circuit 200 and clasp shut, providing an optimum support and segregation design for the flex circuit 200. The latch tabs 616 are used to clasp the wallet shut. The hook and loop mechanism (such as loops) 624 on the latch tabs 616 of the second cover 604 form a releasable engagement bond with the first cover 602 when pressed into contact with the latching mechanism (such as mushroom-shaped stems) 618 on the second side 608 of the first cover. When the releasable engagement bond is engaged, the first cover 602, second cover 604, latch tab 616, and fold line area 606 substantially enclose the base 206 of a flex circuit 200. The wallet 600 thus provides a means for supporting at least one flex circuit 200 such that the base 206 of the flex circuit 200 is substantially enclosed without pinching areas 208 of the flex circuit that protrude from the base.

The wallet 600 provides protection for the flex circuit 200 by providing a barrier that separates the flex circuit 200 from other types of more bulky cables and neighboring equipment that could damage the more fragile flex circuit 200. The wallet 600 also provides advantageous support for the flex circuit 200. The wallet 600 wraps around and supports all surfaces of the flex circuit base 206, which eliminates excessive movement of the flex circuit and minimizes potentially harmful chafing of the flex circuit 200.

Figure 9:
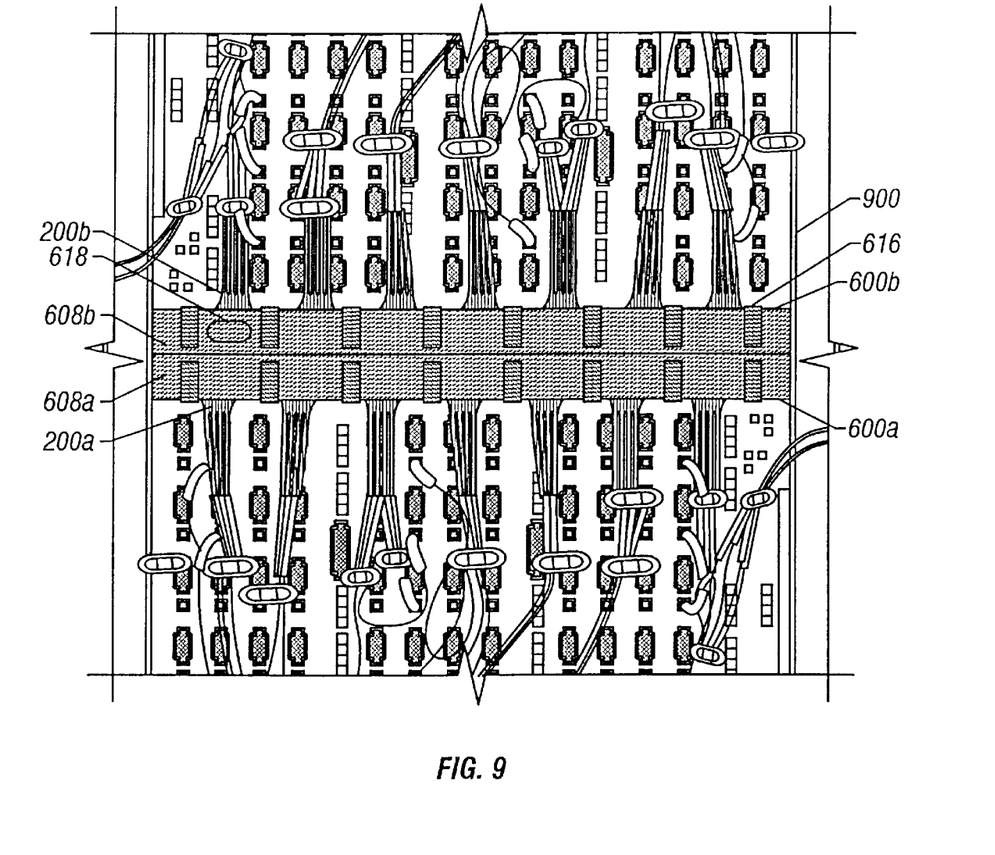
FIG. 9 illustrates a cable system incorporating at least one embodiment of a flex circuit cabling wallet.

FIG. 9 illustrates the use of a plurality of flex circuit cabling wallets 600 to provide support and protection for a plurality of flex circuits 200. The wallet 600 is coupled to the housing frame 900 via adhesive or other coupling means. FIG. 9 illustrates a flex circuit 200a that "dresses down" from a cable wallet 600a to accommodate fiber optic connections on a lower portion of a housing frame 900 of a fiber optic communications system. Another flex circuit 200b "dresses up" to accommodate fiber optic connections on an upper portion of the housing frame 900. One skilled in the art will recognize that each wallet 600 can accommodate one or more flex circuits 200. As illustrated, the cabling wallets 600 can be placed in a location on the housing frame 900 that would traditionally be occupied by a traditional cable duct 100 (See FIGS. 4 and 5).

FIG. 9 illustrates several useful advantages that flow from including a hook and loop latching mechanism 618 on the second side 608 of the first cover 602 (FIG. 6). When pressed into contact with the latching mechanisms 618, the latch tabs provide a releasable engagement bond that holds the wallet 600 in place to surround, protect, and support the flex circuit 200. In addition, the latching mechanism 618 of the second side 602 (FIG. 6) provides a hook and loop surface to which other items may be attached to the housing frame 900, as described below. While the preferred embodiment described herein utilizes a hook and loop engagement bond between the latch tabs 616 and the first cover 602 (FIG. 6), one skilled in the art will recognize that any sufficiently durable latching means can be used, such as snaps, buckles, or clips. Similarly, the manner of affixing the cable wallet 600 to the housing frame 900 may be any affixing means known in the art. In the preferred embodiment, the second cover 604 (FIGS. 7 and 8) of the cable wallet is affixed to the housing frame 900 by means of an adhesive. One skilled in the art will recognize that other coupling means, such as hook and loop fabric, snaps, rivets, screws, magnets, and the like, could also be used.

Figure 10:
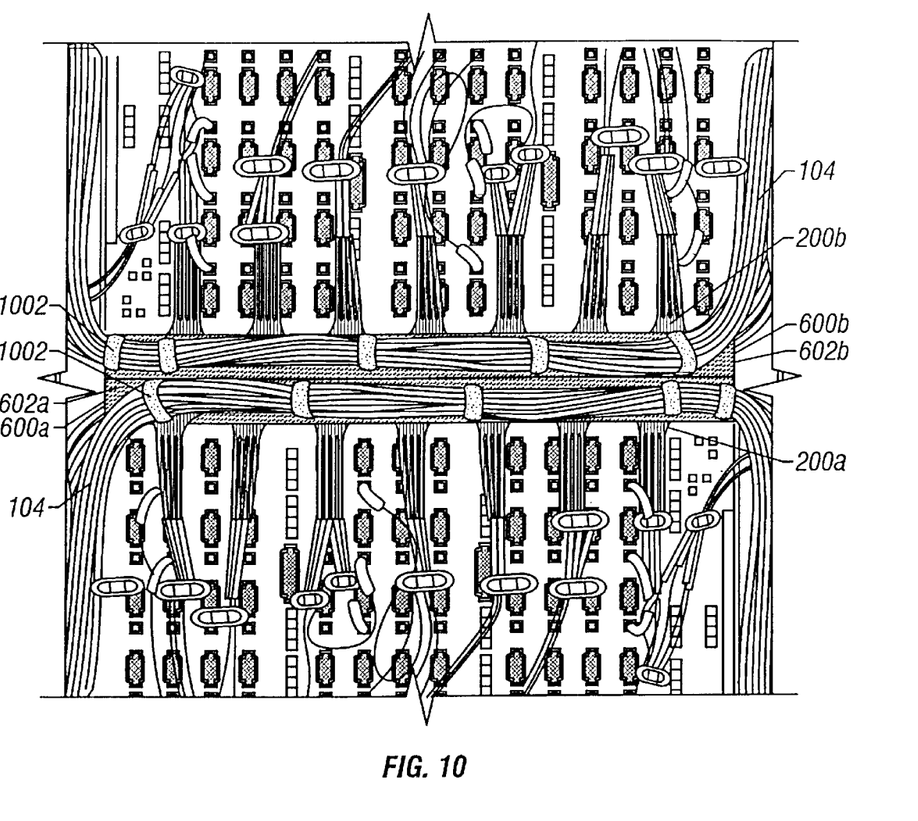
FIG. 10 illustrates a cable system incorporating at least one embodiment of a flex circuit cabling wallet that includes hook and loop cable fasteners.

FIG. 10 illustrates the use of a flex circuit cabling wallet 600 as described herein to manage cable in a system that includes flex circuits 200 as well as traditional jacketed cables 104. FIG. 10 illustrates that the first cover 602a, 602b of the cabling wallets 600a, 600b, respectively, can support additional cable storage and routing options, such as cable fasteners 1002. The cable fasteners 1002 provide a means for supporting one or more cables 104. In the preferred embodiment, the cable fasteners 1002 are hook and loop tie wraps. However, the cable fastener 1002 can be any mechanism that can be made to encircle cables. For instance, the cable fastener 1002 could be a ring of plastic, fabric, string, or other malleable material. One such embodiment would be an elastic ring coupled to an elongated body.

In at least one embodiment, cable routing mechanisms other than cable fasteners 1002 are affixed to the cable wallet 600. These mechanisms can be attached to the cable wallet 600 via hook and loop bond or other coupling means, such as such as adhesive, snaps, buckles, hooks, and the like. The alternative cable routing mechanisms can include, for instance, traditional cable ducts.

FIG. 11 illustrates that attaching additional cables 104 to the outside cover 602 of the wallet 600 via a cable fastener 1002 results in segregation of flex circuits 200 from other cables 104. This segregation provides several advantages. As stated above, the fragile flex circuit 200 is protected from the bulkier cables 104. As such, the flex circuits 200 rest in the secure environment of the wallet 600 while additional cables are attached to the second side of the first cover 602. In addition, if repair, upgrade, or replacement of the flex circuit 200 is necessary, such action can take place without disturbing the cables 104. In such case, the wallet is opened to expose the flex circuit 200, but the cables 104 remain bundled. In this manner, cables 104 are not displaced from their support structure 1002 as would occur when flex circuits 200 and cables 104 are housed together within a traditional cable duct 100 (See FIGS. 4 and 5). It should be noted that the cables 104 described herein are intended to encompass any elongated cable-like materials including metal cables, fiber optic cables, electrical cords, wires, ropes, and the like.

While particular embodiments of the present invention have been shown and described, it will be recognized to those skilled in the art that, based upon the teachings herein, further changes and modifications may be made without departing from this invention and its broader aspects and, thus, the appended claims are to encompass within their scope all such changes and modifications as are within the true spirit and scope of the invention.

What is claimed is:

1. An apparatus comprising:
   a first cover;
   a second cover;
   a fold line area coupled to the first cover and the second cover; and
   at least one latch tab coupled to the second cover;
   wherein the first cover includes a latching mechanism;
   wherein the latch tab is configured to create a releasable bond with the latching mechanism;
   wherein the first cover, fold line area, second cover, and latch tab are configured to enclose a base of a flex circuit and to allow at least one flex circuit finger to extend, in a direction non-parallel to the fold line, from the base of the flex circuit when the releasable bond is engaged;
   wherein the first cover has a first side and a second side;
   wherein the second side includes the latching mechanism;
   wherein the latch tab includes a hook and loop mechanism; and
   wherein the latch tab is configured to create a releasable bond with the latching mechanism when the hook and loop mechanism is pressed into contact with the latching mechanism.

2. The apparatus recited in claim 1 further comprising a cable fastener.

3. An apparatus comprising:
   a cable fastener;
   a first cover;
   a second cover;
   a fold line area coupled to the first cover and the second cover; and
   at least one latch tab coupled to the second cover;
   wherein the first cover includes a latching mechanism;
   wherein the latch tab is configured to create a releasable bond with the latching mechanism;
   wherein the first cover, fold line area, second cover, and latch tab are configured to enclose a base of a flex circuit and to allow at least one flex circuit finger to extend, in a direction non-parallel to the fold line, from the base of the flex circuit when the releasable bond is engaged; and
   wherein the cable fastener comprises a hook and loop tie wrap.

4. The apparatus recited in claim 2, wherein the cable fastener is coupled to the first cover.

5. An apparatus comprising:
   a first cover;
   a second cover;
   a fold line area coupled to the first cover and the second cover;
   at least one latch tab coupled to the second cover; and
   a cable fastener;
   wherein the first cover includes a latching mechanism;
   wherein the latch tab is configured to create a releasable bond with the latching mechanism;
   wherein the cable fastener is configured to create a releasable engagement bond with the first cover; and
   wherein the first cover, fold line area, second cover, and latch tab are configured to enclose a base of a flex circuit when the releasable bond is engaged.

6. A method of managing cable, comprising:
   supporting at least one flex circuit with a flex circuit cabling wallet, wherein the flex circuit cabling wallet includes a first cover, a second cover, a fold line area, a latching mechanism, and at least one latch tab;
   supporting one or more cables with a cable fastener; and
   coupling the cable fastener to the cabling wallet;
   wherein supporting at least one flex circuit with a flex circuit cabling wallet further comprises enclosing a base of the flex circuit with the first cover, second cover, fold line area, and at least one latch tab by creating a releasable bond between the latching mechanism and the at least one latch tab.

7. The method recited in claim 6, wherein:

the cable fastener includes a hook and loop mechanism; and coupling the cable fastener to the cabling wallet further comprises creating a releasable engagement bond between the hook and loop mechanism of the cable fastener and the latching mechanism.

8. A method of managing cable, comprising:

supporting at least one flex circuit with a flex circuit cabling wallet, wherein the flex circuit cabling wallet includes a first cover, a second cover, a fold line area, a latching mechanism, and at least one latch tab;

coupling the flex circuit cabling wallet to a housing frame; and wherein supporting at least one flex circuit with a flex circuit cabling wallet further comprises enclosing a base of the flex circuit with the first cover, second cover, fold line area, and at least one latch tab by creating a releasable bond between the latching mechanism and the at least one latch tab.

9. A cable management apparatus, comprising:

a first cover;

a second cover;

a fold line area coupled to the first cover and the second cover;

at least one latch tab coupled to the second cover; and a cable fastener having a hook and loop mechanism;

wherein the first cover includes a latching mechanism;

wherein the at least one latch tab is configured to create a releasable bond with the latching mechanism;

wherein the first side, fold line area, second side, and latch tab are configured to enclose a base of at least one flex circuit when the releasable bond is engaged;

wherein the latch tab includes a hook and loop mechanism;

wherein the cable fastener is configured to create a releasable engagement bond with the first cover; and wherein the second cover is coupled to a housing frame.

10. The apparatus recited in claim 1 wherein the first cover, fold line area, second cover, and latch tab are configured to allow at least one flex circuit finger to extend, in a direction substantially perpendicular to the fold line, from the base of the flex circuit when the releasable bond is engaged.

11. The apparatus recited in claim 1 wherein said at least one latch tab coupled to the second cover comprises a plurality of latch tabs.

12. The apparatus recited in claim 2 wherein the cable fastener comprises a hook and loop tie wrap.

13. The apparatus recited in claim 3 wherein the cable fastener is coupled to the first cover.

14. The apparatus recited in claim 3 wherein the first cover, fold line area, second cover, and latch tab are configured to allow at least one flex circuit finger to extend, in a direction substantially perpendicular to the fold line, from the base of the flex circuit when the releasable bond is engaged.

15. The apparatus recited in claim 3 wherein said at least one latch tab coupled to the second cover comprises a plurality of latch tabs.

\* \* \* \* \*